(12) United States Patent
Fletcher et al.

(10) Patent No.: US 9,408,318 B2
(45) Date of Patent: Aug. 2, 2016

(54) USB SOLID STATE STORAGE DEVICE CASING FOR AUTOMATED WRITING AND DISPENSING

(76) Inventors: Gordon P. Fletcher, La Mesa, CA (US); Lisbeth M. Fletcher, La Mesa, CA (US)

( * ) Notice: Subject to any disclaimer, the term of this patent is extended or adjusted under 35 U.S.C. 154(b) by 1249 days.

(21) Appl. No.: 13/338,572

(22) Filed: Dec. 28, 2011

(65) Prior Publication Data

US 2013/0003287 A1    Jan. 3, 2013

Related U.S. Application Data

(63) Continuation-in-part of application No. 12/980,128, filed on Dec. 28, 2010, now abandoned, and a continuation-in-part of application No. 13/111,142, filed on May 19, 2011, now abandoned.

(51) Int. Cl.
*H05K 5/00* (2006.01)
*H05K 5/02* (2006.01)

(52) U.S. Cl.
CPC .................................... *H05K 5/0278* (2013.01)

(58) Field of Classification Search
CPC .................. H05K 5/0278; G06K 19/07732
USPC .......... 361/679.03, 679.31; D14/435.1, 480.5
See application file for complete search history.

(56) References Cited

U.S. PATENT DOCUMENTS

| | | | |
|---|---|---|---|
| D404,342 S * | 1/1999 | Goerner | D11/208 |
| D449,615 S * | 10/2001 | Lloyd | D14/435.1 |
| D463,105 S * | 9/2002 | Tsai | D3/207 |
| 6,710,962 B1 | 3/2004 | Caverly et al. | |
| D490,814 S * | 6/2004 | Kim | D14/480.5 |
| D491,143 S * | 6/2004 | Jiang | D14/435.1 |
| 6,763,410 B2 | 7/2004 | Yu | |
| 6,789,164 B2 | 9/2004 | Su et al. | |
| 6,894,864 B2 | 5/2005 | Chang et al. | |
| 6,957,746 B2 * | 10/2005 | Martin | B65H 1/06 221/131 |
| D513,000 S * | 12/2005 | Cohen | D14/480.3 |
| 6,979,210 B2 * | 12/2005 | Regen | H01R 13/629 439/131 |
| 6,980,422 B2 | 12/2005 | Bhogal | |
| 7,095,617 B1 * | 8/2006 | Ni | H05K 5/0278 361/736 |
| 7,119,985 B2 | 10/2006 | Bandic | |
| D555,149 S * | 11/2007 | Griffin | D14/484.1 |
| 7,295,431 B2 | 11/2007 | Chuang | |
| 7,303,127 B2 * | 12/2007 | Brewer | G06K 19/07743 235/457 |
| 7,389,878 B1 | 6/2008 | Torrico | |
| 7,420,803 B2 | 9/2008 | Hsueh et al. | |
| 7,503,780 B1 * | 3/2009 | Huang | H01R 13/4538 439/135 |
| D606,078 S * | 12/2009 | Chen | D14/480.6 |
| D611,946 S | 3/2010 | Wisniewski | |
| 7,685,337 B2 | 3/2010 | Merry, Jr. et al. | |
| 7,704,084 B1 | 4/2010 | Cheng | |
| 7,722,369 B2 * | 5/2010 | Bushby | H01R 13/6397 439/134 |
| 7,780,463 B2 | 8/2010 | Milan | |

(Continued)

*Primary Examiner* — Adrian S Wilson
(74) *Attorney, Agent, or Firm* — Timothy W. Fitzwilliam

(57) ABSTRACT

A storage device has a casing with physical and mechanical features that enable an automated dispenser to reliably move the storage device through a loading and dispensing process therewithin. The casing's physical and mechanical features reduce the chance of a user loading the storage device in an automated dispenser incorrectly. The casing may also improve the stacking of storage devices in a dispenser. The features herein additionally assist a free fall while loading to the automated dispenser. The storage devices may be, for example, USB solid state drives (also referred to as flash drives, thumb drives, or the like), Secure Digital (SD) cards, CompactFlash (CF) cards and the like.

9 Claims, 3 Drawing Sheets

(56) References Cited

U.S. PATENT DOCUMENTS

| | | | |
|---|---|---|---|
| D623,399 S * | 9/2010 | McSweyn | D14/480.5 |
| D623,753 S * | 9/2010 | Saffer | D14/480.5 |
| 7,850,468 B2 | 12/2010 | Ni et al. | |
| D631,053 S * | 1/2011 | Bailey | D10/70 |
| 7,887,342 B1 | 2/2011 | Yu | |
| D640,263 S * | 6/2011 | Huang | D14/480.3 |
| 7,957,130 B2 * | 6/2011 | Yu | H05K 5/0286 361/679.03 |
| D669,899 S * | 10/2012 | Cheng | D14/435.1 |
| D675,630 S * | 2/2013 | Ni | D14/480.1 |
| 9,002,509 B2 * | 4/2015 | Fletcher | G06K 13/103 700/231 |
| 2004/0075977 A1 * | 4/2004 | Lee | G06F 1/1656 361/679.4 |
| 2004/0109259 A1 | 6/2004 | Hiraguchi et al. | |
| 2004/0233629 A1 * | 11/2004 | Wang | B43K 29/08 361/679.4 |
| 2006/0038023 A1 * | 2/2006 | Brewer | G06K 19/005 235/492 |
| 2006/0259188 A1 | 11/2006 | Berg | |
| 2007/0047359 A1 * | 3/2007 | He | H05K 5/0278 365/207 |
| 2007/0247803 A1 * | 10/2007 | Eickholdt | G06F 1/1632 361/679.38 |
| 2008/0090449 A1 | 4/2008 | McLean | |
| 2008/0173598 A1 * | 7/2008 | Fiorentino | H05K 5/0278 211/41.12 |
| 2008/0293274 A1 | 11/2008 | Milan | |
| 2008/0305662 A1 | 12/2008 | Regen | |
| 2009/0158446 A1 | 6/2009 | Harris | |
| 2010/0029167 A1 | 2/2010 | Leung | |
| 2010/0075517 A1 | 3/2010 | Ni et al. | |
| 2010/0110643 A1 | 5/2010 | Lin | |
| 2010/0254079 A1 | 10/2010 | Cheng | |
| 2010/0281209 A1 | 11/2010 | Ni et al. | |
| 2010/0309657 A1 | 12/2010 | Purdy | |
| 2011/0182020 A1 * | 7/2011 | Sato | G11B 17/04 361/679.31 |
| 2012/0087079 A1 * | 4/2012 | Ting | H05K 5/0278 361/679.32 |

* cited by examiner

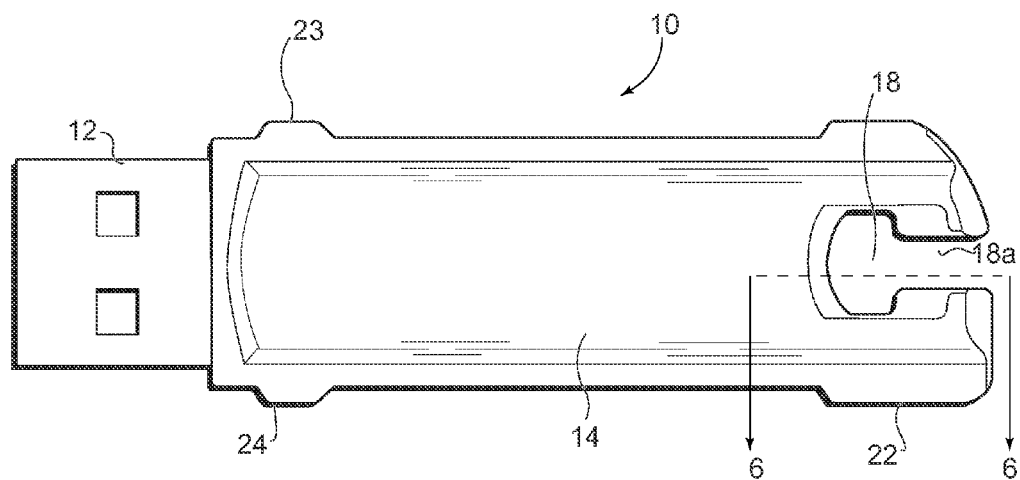
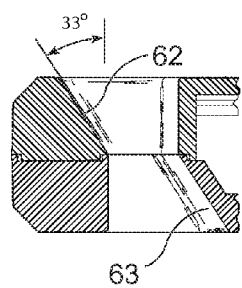
FIG. 6
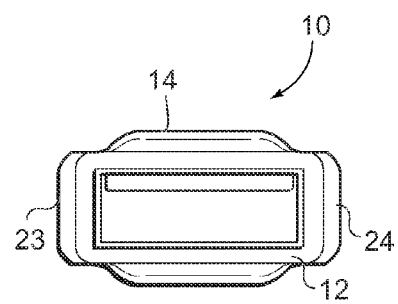
FIG. 5
FIG. 7
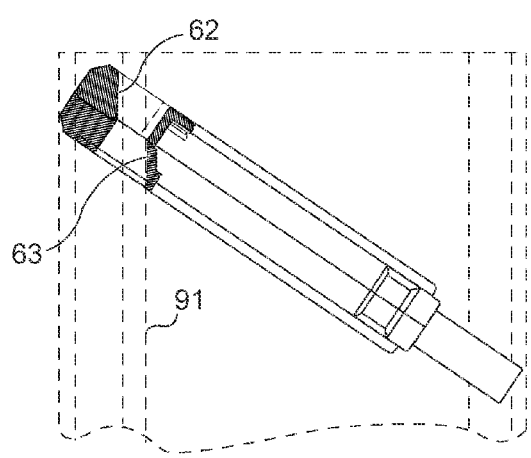
FIG. 8

USB SOLID STATE STORAGE DEVICE CASING FOR AUTOMATED WRITING AND DISPENSING

PRIORITY CLAIM

This patent application is a continuation-in-part and claims benefit of the priority date of U.S. patent application Ser No. 12/980,128 filed on Dec. 28, 2010 now abandoned, entitled SYSTEM FOR WRITING TO AND DISPENSING SOLID-STATE STORAGE DEVICES; additionally this patent application further is a continuation-in-part and claims benefit of the priority date of U.S. patent application Ser. No. 13/111,142 filed on May 19, 2011 now abandoned, entitled USB SOLID STATE STORAGE DRIVE FOR AUTOMATED WRITING AND DISPENSING, accordingly, the entire contents of these patent applications are hereby expressly incorporated by reference.

BACKGROUND OF THE INVENTION

1. Field of the Invention

The present invention pertains generally to providing digital media content. More particularly, the present invention relates to providing solid-state storage devices containing digital data to a user. In a preferred embodiment, the present invention more particularly relates to apparatus and methods for writing to and dispensing solid-state storage devices.

2. Description of the Prior Art

Currently, a growing number of consumers are turning to solid-state storage devices such as thumb drives and memory cards for their computer storage needs in lieu of optical storage devices, such as CD-ROMs and DVDs, due to the increased durability, reliability, portability, and ease of storing and retrieving digital media.

Furthermore, solid-state storage devices may also allow content providers to deliver more timely and relevant content with more flexibility and lower cost as compared to traditional optical storage devices. As such, content providers such as photo labs, digital photographers, software firms, electronic game developers, or movie studios may wish to start providing content on solid-state storage devices instead of or in addition to the optical formats they currently provide.

A lack of physical, electro-mechanical, and mechanical features on currently designed universal serial bus (USB) solid state devices makes loading and dispensing unreliable being prone to mistakes just as misalignment and jamming. Current USB memory device housings are primarily for cosmetic purposes, such as for marketing or branding and are not designed for handling by an automated machine such as a dispenser or a kiosk. In other words, the current devices would be often loaded incorrectly and not easily moved throughout an automated dispenser.

As can be seen, there is a need for a storage device having one or more structural features to aid in the loading and automatic dispensing of the storage device. Therefore, it is an object of the present invention to provide a storage device casing design that has graspable features to assist a machine to move a device throughout in an automation process. It is further an object of the present invention to provide a device with physical features that allow it to free fall within a hopper without jamming in a chute thereof. It is still further an object of the present invention to provide a device casing with additional feature so that it cannot be loaded backward or upside-down. It is yet further an object of the present invention to provide a device design that provides advantages described herein without being perceived as awkward or unsightly by the public.

BRIEF SUMMARY OF THE INVENTION

The present invention specifically addresses and alleviates the above mentioned deficiencies associated with the prior art. More particularly, the present invention in a first aspect, is a storage device having physical feature to aid in loading and automated handling thereof comprising a connector adapted to enable content to be transferred on to or from the storage device; a housing encasing electronics of the storage device; and at least one grasping feature on the housing, the grasping feature adapted to permit an automatic storage device dispenser to automatically load and dispense the storage device.

In another aspect of the present invention, a storage device comprises a connector adapted to enable content to be transferred on to or from the storage device; a housing encasing electronics of the storage device; at least one grasping feature on the housing, the grasping feature adapted to permit an automatic storage device dispenser to automatically load and dispense the storage device; at least one mechanical asymmetry feature, the mechanical asymmetry feature providing an asymmetric design for the housing; and a guiding feature formed in the housing.

More specifically, a preferred embodiment provides that the grasping features are comprised of rectilinear protrusions being spaced apart and extending from at least one side of the housing. Further, the asymmetrical design may be realized as an angled corner on a first side of an end opposite the connector, and a rounded corner at a second side of the end of the connector. It should be readily appreciated that the asymmetrical design could be anywhere on the casing.

Additionally, the guiding feature is additionally characterized as comprising a hole formed in the housing at an end opposite the connector, the hole configured to substantially mate with a rail in the automated machine; a channel coupled to the hole, the channel configured to substantially mate with the rail; and a first angled ledge for assisting a free fall ensuring proper loading to the automated machine.

These, as well as other advantages of the present invention will be more apparent from the following description and drawings. It is understood that changes in the specific structure shown and described may be made within the scope of the claims, without departing from the spirit of the invention.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 5 is a top plan view thereof;

FIG. 6 is a cross-sectional view taken along line 6-6 in FIG. 2;

FIG. 7 is a front end view thereof; and

FIG. 8 is a side aspect view with a sectional cutaway of a device in a hopper.

DETAILED DESCRIPTION OF THE PREFERRED EMBODIMENTS

Figure 1:
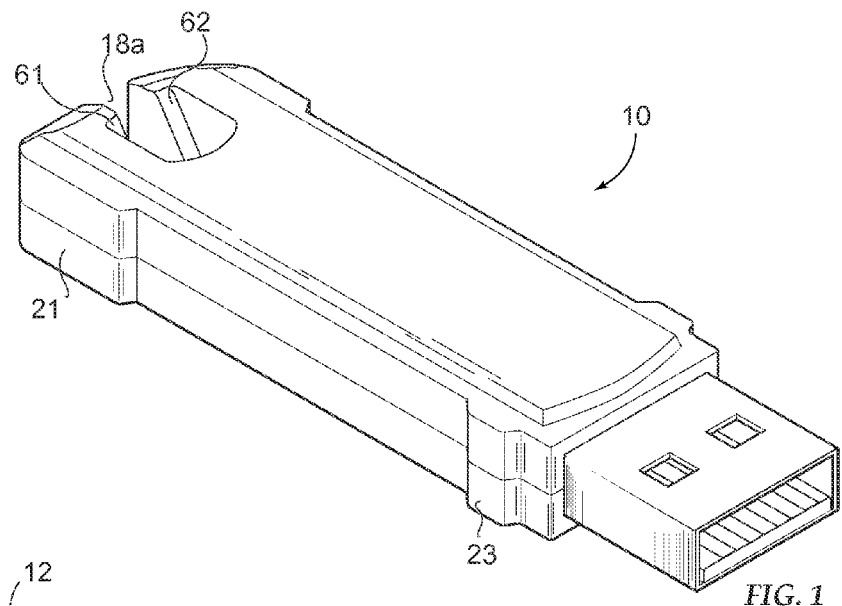
FIG. 1 illustrates a first perspective view of a preferred embodiment the present invention.

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. Broadly with regard to FIG. 1 and FIG. 2, embodiments of the present invention generally provide a storage device 10 having a casing 14 with physical and mechanical features 18, 20, 21, 22, 23, 24, 61, 62, 63, that enable an automated dispenser to reliably move the storage device 10 through a loading and dispensing process therewithin. The casing's 14 physical and mechanical features reduce the chance of a user loading the storage device in an automated dispenser 90 (FIG. 3A and FIG. 3B) incorrectly. The casing additionally improves the stacking of storage devices 10 in a dispenser. The casing 14 may also improve the ability of automated dispensers to move the storage device through the writing and dispensing process. The storage devices one of a variety of types, for example, USB solid state drives (also referred to as flash drives, thumb drives, or the like as illustrated), Secure Digital (SD) cards, Compact Flash (CF) cards, micro (SD) and the like.

Figure 2:
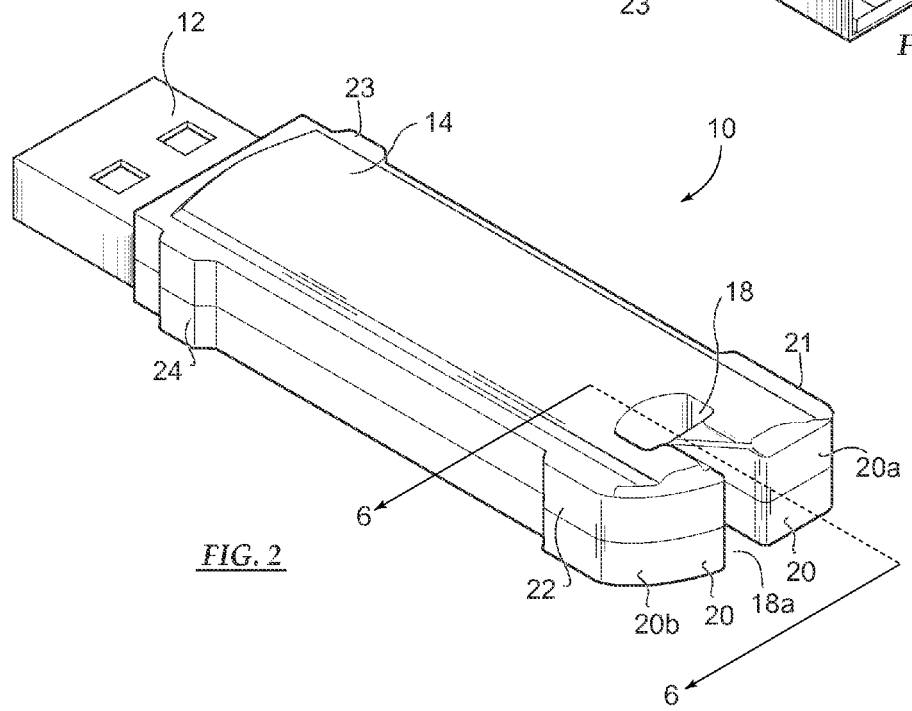
FIG. 2 illustrates a second perspective view from a rear aspect with respect to FIG. 1.

Further referring to FIG. 1 and FIG. 2, a USB flash device 10 may include one or more features 18, 20, 21, 22, 23, 24, 61, 62, 63, that help align the device 10 in an automated dispenser. Further, the features prevent backwards or upside down loading of the device 10 in an automated dispenser and facilitates moving the device 10 through the process of writing and dispensing in the automated dispenser 90. One example of an automated dispenser useful in the present invention is described in U.S. patent application Ser. No. 12/980,128, filed Dec. 28, 2010, the contents of which are herein incorporated by reference.

The storage device 10 further includes a connector 12, including a ground shield, a case housing 14 and electronics 16 disposed inside the case housing 14. The storage device 10 may further include a guiding feature 18 which, in a preferred embodiment, is realized as a hole 18 formed at an end opposite the connector 12. Or more particularly, the feature comprises a hole 18 coupled to a channel 18a. In alternative embodiments, the guiding feature 18 may communicate externally of the housing 14.

Figure 3A:
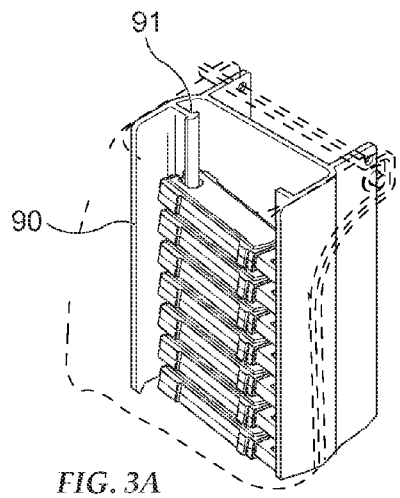
FIG. 3A is a perspective illustration showing a device loaded to a dispenser hopper.
Figure 3B:
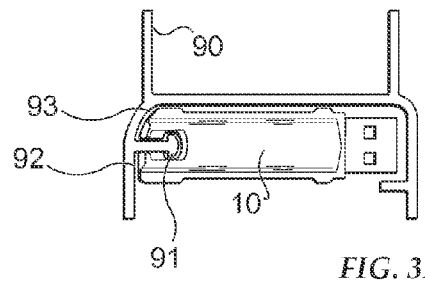
FIG. 3B is a top plan view of the device loaded to a dispenser hopper.

With reference to FIG. 3A and FIG. 3B, the guiding feature 18 in a preferred embodiment, permits the storage device 10 to slide along a rail, such as a T-rail 91, in the automated dispenser 90. The guiding feature 18 may enable the storage device 10 to be easily stacked, may reduce the risk of incorrect loading, and may align the storage device 10 for use in the automated dispenser 90.

The storage device 10 may further include one or more mechanical asymmetry features 20. In some embodiments, the mechanical asymmetry features 20 may include different surface shapes 20a, 20b on specific locations of the housing 14. For example, at the end opposite of the connector 12, one side of the end may be rounded 20b with a particular radius of curvature while the other side of the end may be more angular 20a, having, for example, sharp angles. As illustrated in FIG. 3B, the angled surface 20a that does not have any curvature is guided by complementary surface 92 of the automated dispenser 90. Similarly, rounded surface 20b is also guided by complementary surface 93. The mechanical asymmetry features 20, 20a, 20b may reduce the ability for a user to load the storage device 10 upside down or backward in to an automated dispenser.

The storage device 10 may further include one or more graspable features 21, 22, 23, 24. The graspable features 21, 22, 23, 24 may include, for example, protrusions on one or both sides of the storage device 10, having a defined indentation there between. In some embodiments, the graspable features 21, 22, 23, 24 may be formed on a top and/or bottom surface of the housing 14. The graspable features 21, 22, 23, 24 may enable an automated dispenser to reliably move the storage device 10 through the writing and dispensing process.

Figure 4:
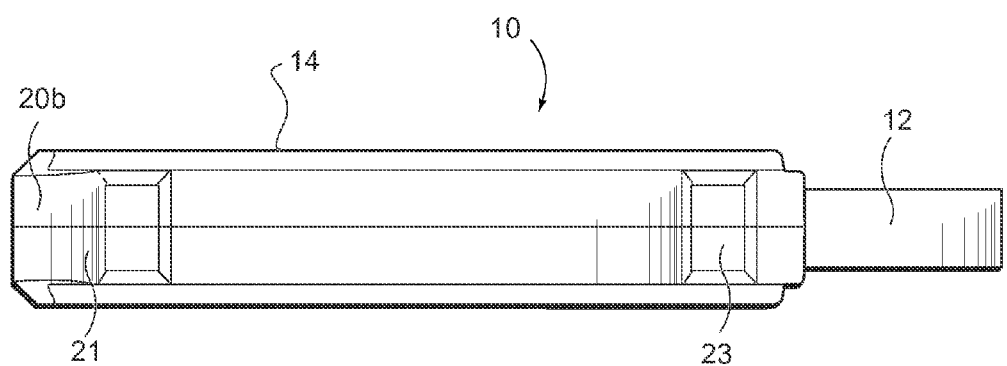
FIG. 4 is further a side aspect view thereof.

With reference to FIG. 4 and FIG. 5, the casing or housing 14 comprises an upper and lower half in a preferred embodiment. Optionally, the features of the storage device 10, such as the graspable features 21, 22, 23, 24, may be molded at the time of forming the housing 14, or may be added on to an existing storage device casing 14. Similarly, the mechanical asymmetry features 20 may be in the same mold as the housing 14 or may be added on after the housing 14 molding is complete.

FIG. 6 provides a cross sectional view taken along line 6-6 in FIG. 2 or FIG. 5. As shown the guiding feature 18, 18a has a plurality of ledges 61, 62, 63 angled to assist in a free fall of a device as loaded to a dispenser 90 (see also FIG. 8). In this particular embodiment, first and second angled ledges 61, 62 are on opposing sides of the channel 18a; and a third angled ledge 63 is opposite the channel 18a.

While the above description refers to flash drives, other storage devices may be configured with the features described here within to permit those storage devices to operate in an automated dispenser. For example, SD card, CF card, Memory Stick, micro (SD) and other solid state storage devices may be used within the scope of the present invention.

It should be understood, of course, that the foregoing relates to exemplary embodiments of the invention and that modifications may be made without departing from the spirit and scope of the invention as set forth in the following claims.

Many alterations and modifications may be made by those having ordinary skill in the art without departing from the spirit and scope of the invention. Therefore, it must be understood that the illustrated embodiments have been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

While the particular USB Solid State Storage Casing for Automated Writing and Dispensing as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

What is claimed is:

1. A storage device comprising:
    a connector adapted to enable digital content to be transferred onto or from the storage device;
    a housing encasing electronics of the storage device;
    at least one grasping feature configured to the housing, the grasping feature further provided to permit an automated machine to move the storage device thereabout, further wherein the grasping feature including a pair of rectilinear protrusions spaced apart and having a defined indentation therebetween and extending from at least one side of the housing; and
    a guiding feature configured to the housing, the guiding feature comprising a first straight angled ledge for assisting a free fall to the automated machine.

2. The storage device of claim 1, further comprising at least one mechanical asymmetry feature, the mechanical asymmetry feature providing an asymmetric design for the housing and further preventing improper loading to the automated machine.

3. The storage device of claim 2, the at least one mechanical asymmetry feature comprising an angled corner on a first side of an end opposite the connector, and a rounded corner at a second side of the end opposite the connector.

4. The storage device of claim 1, the guiding feature further for assisting proper loading to the automated machine, the guiding feature further comprising:
    a hole formed in the housing at an end opposite the connector, the hole configured to substantially mate with a rail in the automated machine; and
    an elongated channel coupled to the hole, the channel additionally configured to substantially mate with the rail.

5. The storage device of claim 1, wherein the storage device is a universal serial bus (USB) solid state storage device.

6. A storage device comprising:
    a connector adapted to enable digital content to be transferred onto or from the storage device;
    a housing encasing electronics of the storage device;
    at least one mechanical asymmetry feature, the mechanical asymmetry feature providing an asymmetric design for the housing, and further preventing improper loading to an automated machine, and further comprising a guiding feature configured to the housing, the guiding feature for assisting proper loading to the automated machine, the guiding feature further comprising:
    a hole formed in the housing at an end opposite the connector; and
    an elongated channel coupled to the hole, the channel, together with the hole, configured to substantially mate with the T-rail.

7. The storage device of claim 6, further comprising a grasping feature configured to the housing, the grasping feature further provided to permit the automated machine to move the storage device thereabout.

8. The storage device of claim 7, the grasping feature comprising a plurality of rectilinear protrusions, the protrusions spaced apart and extending from at least one side of the housing.

9. The storage device of claim 6, the at least one mechanical asymmetry feature comprising an angled corner on a first side of an end opposite the connector, and a rounded corner at a second side of the end opposite the connector.

* * * * *